United States Patent [19]
Chau et al.

[11] Patent Number: 5,891,809
[45] Date of Patent: *Apr. 6, 1999

[54] MANUFACTURABLE DIELECTRIC FORMED USING MULTIPLE OXIDATION AND ANNEAL STEPS

[75] Inventors: Robert S. K. Chau; Lawrence N. Brigham, both of Beaverton; Chia-Hong Jan; Chan-Hong Chern, both of Portland; Binny P. Arcot, Beaverton, all of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 536,653

[22] Filed: Sep. 29, 1995

[51] Int. Cl.$^6$ .................................................. H01L 21/31
[52] U.S. Cl. ......................... 438/770; 438/775; 438/787
[58] Field of Search .................................. 437/238, 239; 438/396, 397, 419, 442, 443, 451, 527, 548, 768, 769, 770, 775, 787

[56] References Cited

U.S. PATENT DOCUMENTS

| | | | |
|---|---|---|---|
| 3,556,879 | 1/1971 | Mayer | 148/191 |
| 4,159,917 | 7/1979 | Gluck | 148/1.5 |
| 4,231,809 | 11/1980 | Schmidt | 148/1.5 |
| 5,028,560 | 7/1991 | Tsukamoto et al. | 437/81 |
| 5,057,463 | 10/1991 | Bryant et al. | 437/238 |
| 5,174,881 | 12/1992 | Iwasaki et al. | 204/298.25 |
| 5,244,843 | 9/1993 | Chau et al. | 437/239 |
| 5,256,563 | 10/1993 | Moleshi et al. | 437/152 |
| 5,455,204 | 10/1995 | Dobuzinsky et al. | 437/238 |
| 5,686,748 | 2/1995 | Thakur et al. | 257/310 |

OTHER PUBLICATIONS

"Optimization of Low–Pressure Nitridation/Reoxidation of SiO$_2$ for Scaled MOS Devices," Woodward Yang, Raj Jayaraman, and Charles G. Sodini, IEEE Transactions on Electron Devices, vol. 35, No. 7, Jul. 1988, pp. 935–944.

"Improved Reliability Characteristics of Submicrometer nMOSFET's with Oxynitride Gate Dielectric Prepared by Rapid Thermal Oxidation in N$_2$O," Hyunsang Hwang, Wen-chi Ting, Dim–Lee Kwong, and Jack Lee, IEEE Electron Device Letters, vol. 12, No. 9, Sep. 1991, pp. 495–497.

"Rapid Thermal Processing of Gate Dielectrics," Arnon Gat and Jaime Nulman, Semiconductor International, May 1995, pp. 120–124.

"Formation of Silicon Nitride at a Si–SiO$_2$ Interface during Local Oxidation of Silicon and during Heat–Treatment of Oxidized Silicon in NH$_3$ Gas," E. Kooi, J.G. van Lierop, and J.A. Appeals, Philips Research Laboratories, Eindhoven, The Netherlands.

"Retardation of Destructive Breakdown of SiO$_2$ Films Annealed in Ammonia Gas," Takashi Ito, Hideki Arakawa, Takao Nozaki, and Hajime Ishikawa, J. Electrochem. Soc.: Solid–State Science and Technology, vol. 10, Oct. 1980, pp. 2248–2251.

"Radiation Effects in Nitrided Oxides," F.L. Terry, Jr., R.J. Aucoin, M.L. Naiman, and S.D. Senturia, IEEE Electron Device Letters, vol. EDL–4, No. 6, Jun. 1993, pp. 191–193.

(List continued on next page.)

*Primary Examiner*—Charles Bowers
*Assistant Examiner*—Reneé R. Berry
*Attorney, Agent, or Firm*—Blakely, Sokoloff, Taylor & Zafman LLP

[57] ABSTRACT

A method of forming a thin, robust nitrided oxide layer. The process results in a manufacturable, uniform, low-defect density, reliable nitrided oxide that may be used as a gate dielectric, as a portion of a spacer, or as a portion of a trench isolation. First, a substrate is oxidized in a chlorinated dry oxidation followed by a low temperature pyrogenic steam oxidation. Next, a low temperature ammonia anneal is performed, followed by a high temperature anneal in an inert ambient.

38 Claims, 5 Drawing Sheets

OTHER PUBLICATIONS

"Effects of Final Annealing on Hot–Electron–Induced MOSFET Degradation," F.C. Hsu, J. Hui, and K.Y. Chiu, IEEE Electron Device Letters, vol. EDL–6, No. 7, Jul. 1985, pp. 369–371.

"Properties of Thin Oxynitride Gate Dialectrics produced by Thermal Nitridation of Silicon Dioxide," M. L. Naiman, F. L. Terry, J. A. Burns, J. I. Raffel, and R. Aucoin, CH1616–2/80/0000–0562, 1980 IEEE, pp. 562–563.

"Advantages of Thermal Nitride and Nitroxide Gate Films in VLSI Process," Takashi Ito, Tetsuo Nakamura, and Hajime Ishikawa, IEEE Transactions on Electron Devices, vol. ED–29, No. 4, Apr. 1982, pp. 498–502.

"Very Lightly Nitrided Oxide Gate Mosfets for Deep–Sub–Micron CMOS Devices," Hisayo Sasaki Momose, Toyota Morimoto, Yoshio Ozawa, Masakatsu Tsuchiaki, Mizuki Ono, Kikuo Yamabe, and Hiroshi Iwai, CH3075–9/91/0000–0359, 1991 IEEE, pp. 359–362.

MANUFACTURABLE DIELECTRIC FORMED USING MULTIPLE OXIDATION AND ANNEAL STEPS

BACKGROUND OF THE INVENTION

1. Field of the Invention

The present invention relates to the field of semiconductor devices and more particularly to a method for forming a reliable, low-defect, thin dielectric layer.

2. Art Background

In the semiconductor industry, dielectric films, such as silicon dioxide films ($Si_tO_2$, also called "oxide" films) are used in a variety of applications. One important use of an oxide layer is as a gate oxide disposed between the gate of an MOS device and a channel region in the device. In recent years, as device dimensions are scaled to provide for high density and high performance devices, it has become increasingly important to provide extremely thin, reliable, low-defect and manufacturable gate oxides. For example, gate oxides as thin as approximately 25 Å are currently under development.

Oxide layers have been treated with nitrogen containing compounds to improve transistor hot electron reliability. In addition to the improved hot electron reliability, these oxides are insensitive to radiation and provide a barrier to various dopants, such as boron, and contaminants. The treatment may include exposing an oxide film to a compound containing chemically active nitrogen, or forming the oxide film in the presence of such compound. The resulting film typically comprises nitrogen incorporated therein, and may be represented by the formula $Si_xO_yN_z$. It will be appreciated that the chemical structure and composition may vary depending upon the process, and in a given process may vary throughout the film. Regardless of the chemical structure and composition of the film, all such films are referred to as "nitrided oxides" herein. The nitrided oxides have been produced by furnace or rapid thermal processing (RTP) oxidation using nitrous oxide ($N_2O$). Alternatively, a dry oxide using furnace or rapid thermal processing may be formed followed by nitridation using $N_2O$, or ammonia ($NH_3$), or a combination of both in a furnace or RTP system. If desired, the nitrided oxide may then be reoxidized using dry $O_2$ or $N_2O$ in a furnace or RPT system. However, these methods have proved to be not manufacturable because of high defect density of the nitrided oxide and/or poor thickness uniformity and control. In addition to the manufacturability problems, the nitridation process is also known to lead to the formation of a large number of electron traps, interface states, high fixed positive charge density, and a susceptibility to stress induced interface state formation, all of which have a deleterious effect on device performance.

What is needed is a manufacturable method of forming a nitrided oxide. The nitrided oxide should have low-defect density, and good thickness uniformity and control. Furthermore, the process should be capable of producing a very thin oxide. Moreover, it is desirable that the oxide may be useful as, for example, a gate oxide, a spacer oxide, a composite oxide or a portion of a trench oxide.

SUMMARY OF THE INVENTION

A method of treating an oxide layer is disclosed. The oxide layer may be formed by, for example, performing a first oxidation in an ambient comprising chlorine, followed by a second oxidation in an ambient comprising steam. An inert purge step may then be performed after the steam oxidation. Next, the oxide layer is exposed to an ambient comprising a nitrogen containing compound that nitridizes the oxide layer in an RTP system. Then, the layer is annealed at a higher temperature in an inert ambient. The invented process has proven to provide a high quality, high reliability, thin oxide film in a manufacturable process.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION OF THE INVENTION

A method of treating an oxide layer is described. In the following description, numerous specific details are set forth such as materials, gas mixtures, flow rates, times, temperatures, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

As will be described in detail below, one embodiment of the present invention comprises a furnace cycle to grow a thin, uniform, and robust oxide layer. The furnace cycle is then followed by an RTP cycle wherein the oxide layer is nitridized to form a nitrided oxide. The oxide layer may be grown, for example, on a silicon substrate, or on a silicon or polysilicon layer or structure formed on a substrate. Alternatively, the oxide layer may be grown on a different semiconductor substrate, layer, or structure. Although embodiments describing three exemplary thicknesses are described, the present invention may be used to form an oxide layer of any desired thickness. It is been found that the present invention is particularly useful in forming relatively thin oxide layers, such as in the range of approximately 20 Å–80 Å, for example.

Figure 1:
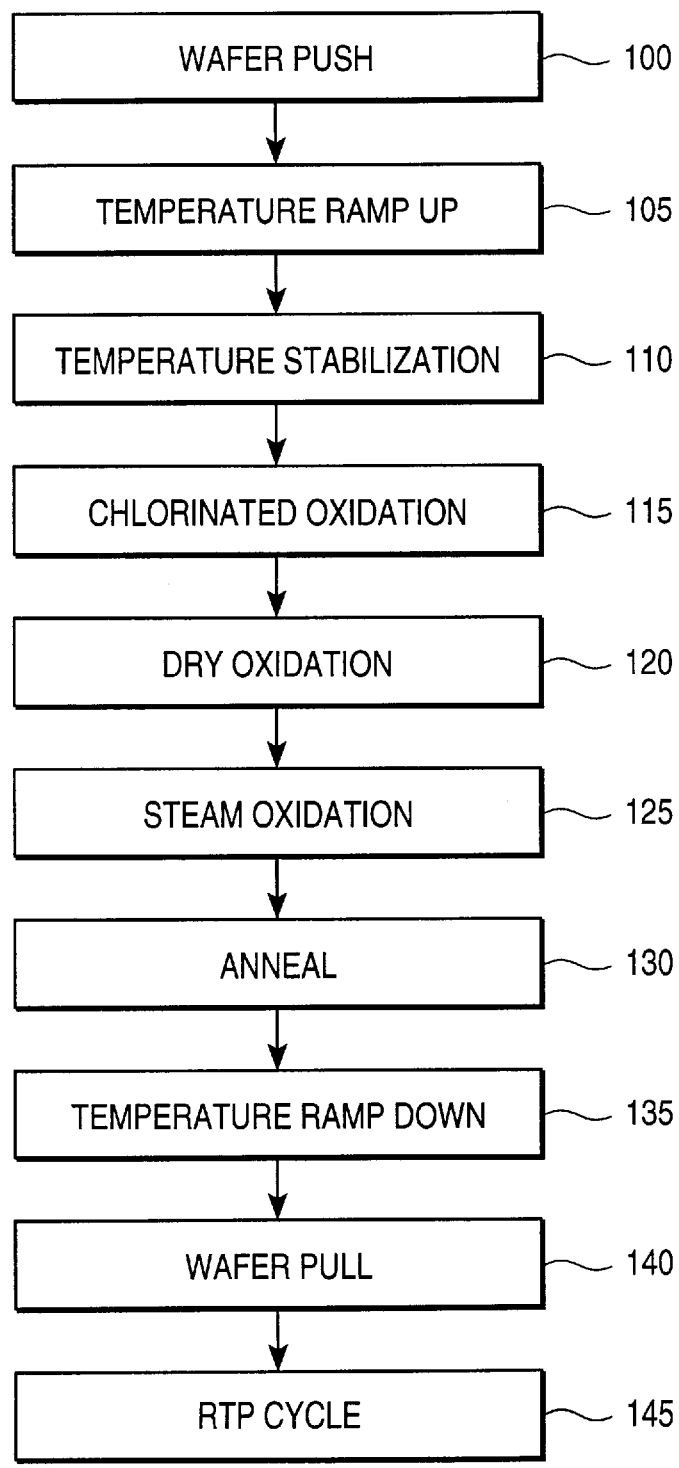
FIG. 1 shows a block diagram of a process for forming an oxide layer in one embodiment of the present invention.
Figure 2:
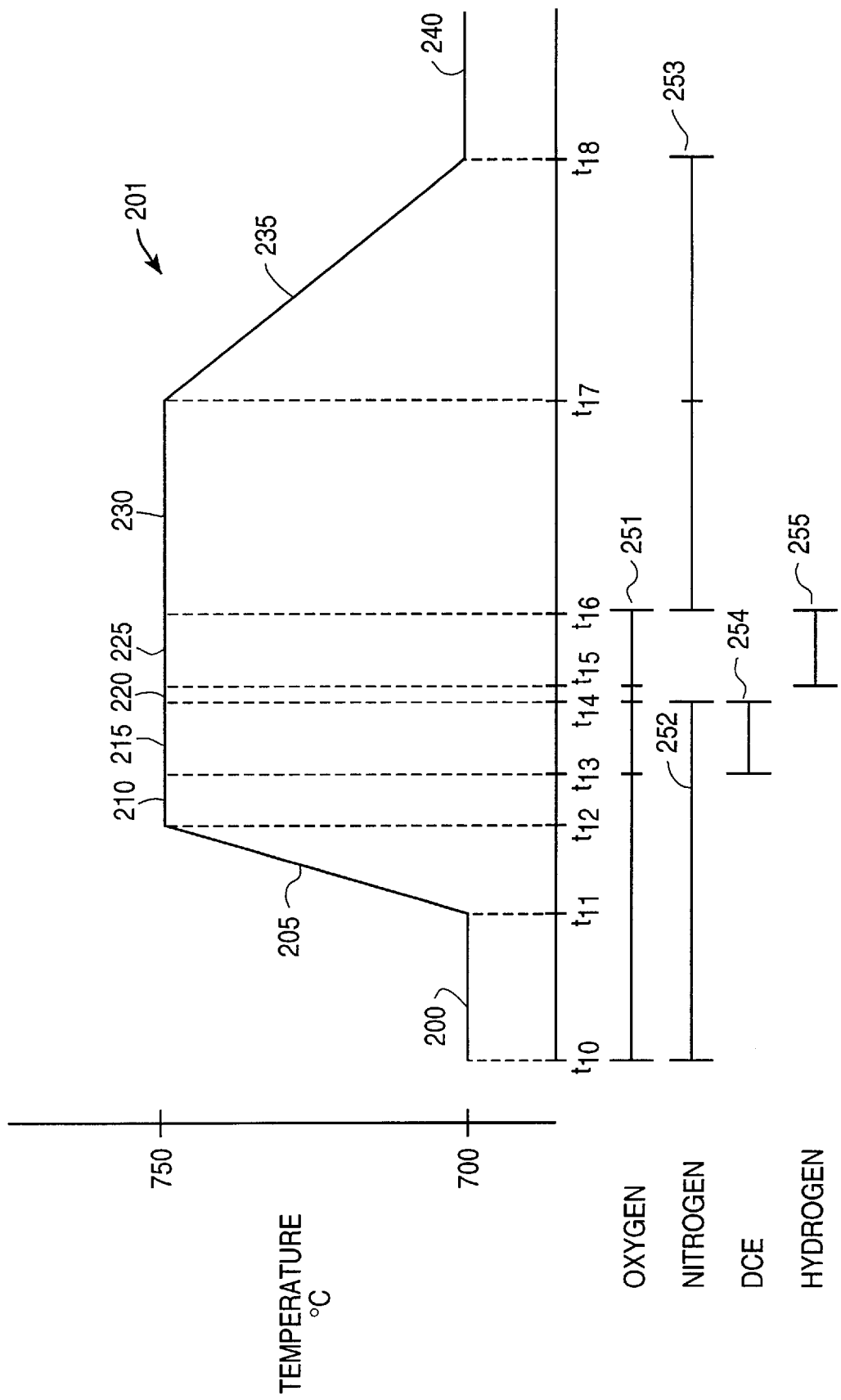
FIG. 2 is a diagram illustrating the oxidation process of FIG. 1.

FIG. 1 shows a flow diagram of the furnace cycle. FIG. 2 is a diagram illustrating details of the furnace cycle. The furnace cycle will be described in conjunction with FIGS. 1 and 2. FIG. 1 shows the sequence of steps in a preferred embodiment. In FIG. 2, graph 201 shows the temperature in the furnace as the process progresses. Bars 251–255 show the presence of various gases at various times during the process. In many cases, such as oxygen shown by bar 251, the flow rate of oxygen is not, in the preferred embodiment, the same throughout the entire time period represented by bar 251. Changes in flow rate of gases such as oxygen in bar 251 and nitrogen in bar 253 from one point in the process to another are indicated by hash marks along the bars, as will be described more fully below.

First, in step 100, the wafers are pushed into the furnace. In a preferred embodiment the furnace is a Kokusai Vertron III vertical furnace. In a preferred embodiment, the temperature in the furnace during the step is approximately 700° C. for the embodiment described below for growing oxide layers of approximately 53 Å and 35 Å, and 650° C. for an oxide layer of 27 Å. Also in a preferred embodiment, nitrogen flows at a rate of 9.9 standard liters per minute (slm) and oxygen flows at a rate of 0.1 slm. This first step is shown as segment 200 in FIG. 2 and lasts from $t_{10}$ to $t_{11}$. In a preferred embodiment, the total time of segment 200, i.e. the time from $t_{10}$ to $t_{11}$ is approximately 21 minutes. In a preferred embodiment, with a tube length of 1.15 meters, the push rate is 60 mm/minute.

Next, in step 105 the temperature is ramped from 700° C. to 725° C. or 750° C. as will be discussed below. This is shown by segment 205 of FIG. 2. During this step, the nitrogen flow remains at 9.9 slm and the oxygen flow remains at 0.1 slm. This step lasts for a time ($t_{11}$ to $t_{12}$) of approximately 12 minutes in a currently preferred embodiment. Next, in step 110 the temperature is allowed to stabilize at 725° C. or 750° C. as shown by segment 210 of FIG. 2 ($t_{12}$ to $t_{13}$) for approximately 6 minutes. Again, the nitrogen flow remains at 9.9 slm and the oxygen flow remains at 0.1 slm.

In the embodiment described above, where the gas flow is primarily nitrogen, with approximately 1% oxygen, native oxide growth is tightly controlled. That is, the presence of oxygen allows for some native oxide growth, but, since the flow is relatively small, the thickness of the native oxide is relatively low (e.g. approximately 5 to 10 Å) and uniform. The nitrogen flow during the wafer push prevents excessive native oxide growth from reaction with atmospheric oxygen during the wafer push. The ability to grow a thin yet uniform native oxide film is important because this film protects what otherwise be a bare surface from chlorine attack during subsequent steps. On the other hand, if the thickness of the film were not controlled by flow of an inert such as $N_2$ during push, temperature ramp, and stabilization, a thicker and less uniform oxide film would grow and process control of the final film thickness would be degraded. Of course, if chlorine attack of the substrate is not a concern, the native oxide need not be grown. Alternatively, if the process can withstand a thicker and less uniform oxide layer, the flow of nitrogen and oxygen may be different from described herein. Preferably the oxygen concentration should be no greater than approximately 5% to grow a controlled, uniform native oxide film. It is preferable that the ambient during push comprise at least some oxygen, because a pure nitrogen ambient may cause pitting of a substrate that does not have at least a thin oxide layer.

Next, in step 115 a dry oxidation in a chlorine containing ambient is performed. This is shown as segment 215 ($t_{13}$ to $t_{14}$) in FIG. 2. In a preferred embodiment, the oxygen flow rate is increased to approximately 9.03 slm. Also in this step dichloroethylene (DCE, chemical formula $C_2H_2Cl_2$) is flowed by bubbling nitrogen through liquid DCE. In a preferred embodiment, the nitrogen flow rate is approximately 0.97 slm. In a preferred embodiment, step 115 is performed for a time of approximately 10 minutes, at a temperature of approximately 750° C. in an embodiment wherein the final oxide thickness is desired to be approximately 53 Å. In this embodiment, after step 115 the total oxide thickness (including the native oxide grown during push, ramp and stabilization) is approximately 25 Å. The embodiment to grow approximately 53 Å is illustrated in FIG. 2. In an embodiment designed to grow approximately 35 Å total oxide thickness, step 115 is performed for 8 minutes at a temperature of 725° C. In this embodiment, after step 115, the total oxide thickness is approximately 20 Å. In an embodiment designed to grow approximately 27 Å total oxide thickness, step 115 is performed for a time of 3 minutes at a temperature of 725° C. In this embodiment, after step 115, the total oxide thickness is approximately 15 Å. Although FIG. 2 shows the diagram for the process to grow the 53 Å total oxide thickness, the graph for the embodiments to grow the 35 Å oxide and the 27 Å oxide would look generally similar, with curve 201 having a lower value between time $t_{12}$ and time $t_{17}$.

In the present invention, the volume concentration of chlorine is approximately 9% or greater during the chlorinated oxydation step. Use of the high chlorine concentration is helpful in providing a clean substrate surface and a low-defect oxide layer. The high chlorine concentration is particularly helpful in the relatively low temperature oxidation steps of the present invention since chlorine is less active at lower temperatures. Because the oxide layer is relatively thin, the chlorine is able to remove contaminants, including metal contaminants such as sodium, from the semiconductor substrate. The chlorine reacts with the contaminant to form a volatile compound such as a volatile metal chloride. The volatile compound may then diffuse through the thin oxide layer, and be carried away with the waste gas stream. However, because there is the thin oxide layer present from the earlier steps, the substrate surface is protected from excessive attack from chlorine, which could lead to pitting. Although the present invention preferably uses a chlorine concentration of approximately greater than or equal to 9%, other percentages, such as approximately 5% or more, may be used. It will be appreciated that other sources of chlorine may be used. For example, pure chlorine gas (Cl2), anhydrous hydrogen chloride (HCl), trichloroethane (TCA, chemical formula: $C_2H_3Cl_3$), or trichloroethylene (TCE, chemical formula: $C_2HCl_3$) may be used.

Following the chlorinated dry oxidation, in step 120 a non-chlorinated dry oxidation, at 725° C. or 750° C. is performed. This is shown as segment 220 in FIG. 2. The duration of this step, i.e. the time from $t_{14}$ to $t_{15}$, is approximately 2 minutes in the preferred embodiment. In a preferred embodiment, this is carried out in 100% oxygen, with the oxygen flow rate set at 10 slm. Once again, other flow rates could be used. Additionally, an inert gas such as nitrogen may be used during this step. This step essentially purges the system of chlorine. If desired, this step may be omitted.

Next, in step 125 a wet or steam oxidation is performed. This portion of the process is shown as segment 225 ($t_{15}$ to $t_{16}$) of FIG. 2. As shown, oxygen and hydrogen flow during this step so that pyrogenic steam is created. In a currently preferred embodiment, oxygen flows at a rate of approximately 5 slm and hydrogen flows at a rate of approximately 2 slm. As with step 115, the time and temperature of this step vary depending upon the desired thickness of the final oxide. For the embodiment wherein an oxide layer of 53 Å total thickness is desired, the step 125 is carried out at a temperature of 750° C., for a time of 13 minutes. For the embodiment wherein a total oxide thickness of approximately 35 Å is desired, the step is carried out at a temperature of approximately 725° C. for a time of approximately 5.5 minutes. Finally, in the embodiment wherein a total oxide thickness of 27 Å is desired, this step is carried out at a temperature of 725° C., for a time of 3 minutes. Step 125 grows the remainder of the desired oxide thickness. That is, the total oxide thickness is 57 Å, 35 Å and 27 Å in the embodiments described above after step 125.

Next, an anneal at 725° C. (35 Å and 27 Å embodiments) or 750° C. (57 Å embodiment) is performed as shown in step 130. This is shown as segment 230 of FIG. 2. In a currently preferred embodiment, the anneal is performed at the temperatures mentioned above in pure nitrogen. In one embodiment, the nitrogen flow rate is equal to approximately 10 slm. Also in a preferred embodiment, the time of this step, i.e. the time between $t_{16}$ and $t_{17}$ is 30 minutes. The nitrogen anneal purges the steam from the furnace to stop any further oxidation. The nitrogen anneal has been found to be helpful in promoting good oxide thickness uniformity. Following the anneal, the temperature is ramped down to 700° C. in step 135. During the ramp down, nitrogen continues to flow at a rate of approximately 10 slm. The ramp down is performed for a time ($t_{17}$ to $t_{18}$) of approximately 34 minutes. Then, in step 140, the wafers are pulled from the furnace at 700° C. At this point, the substrate has a thin, uniform, low-defect, high-quality oxide having the thicknesses as described above. The described process has been found to manufacturably produce uniform layers of high-quality oxide.

Figure 3:
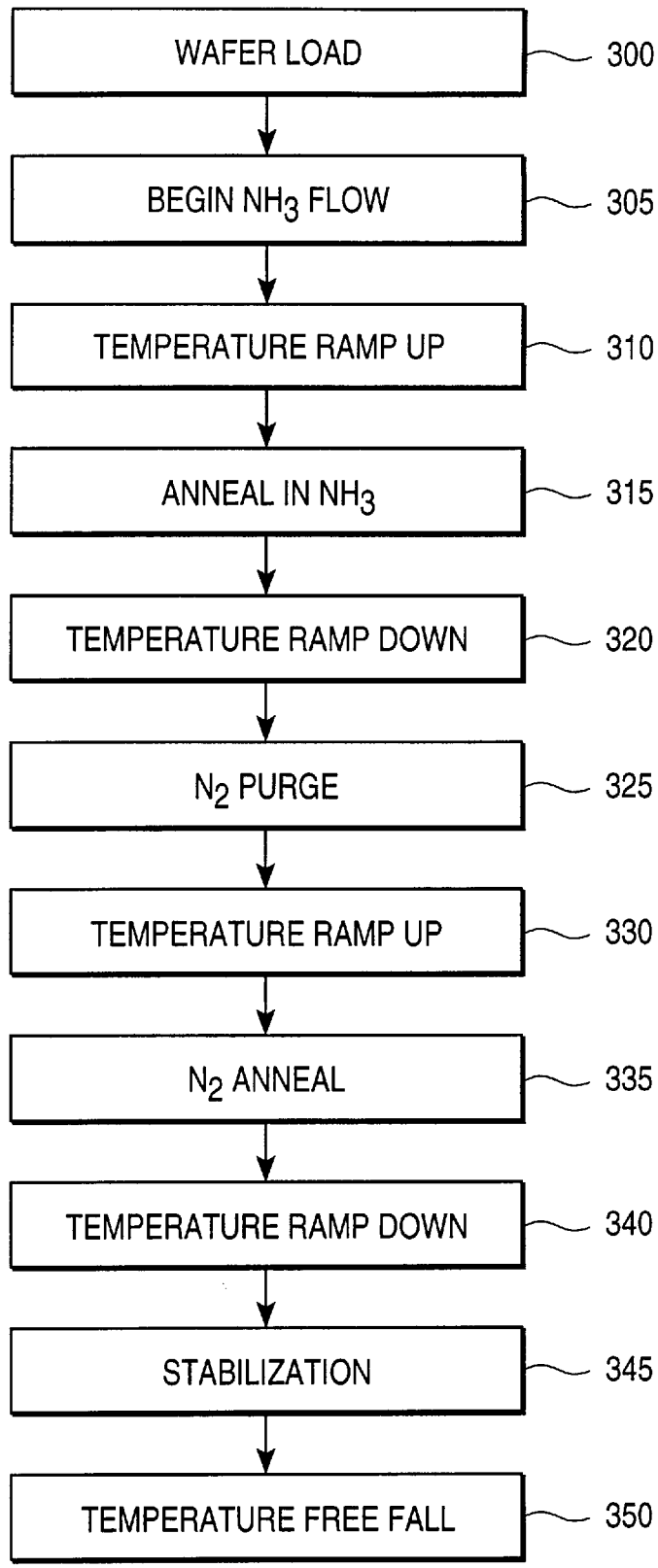
FIG. 3 is a block diagram of a nitridation process according to an embodiment of the present invention.
Figure 4:
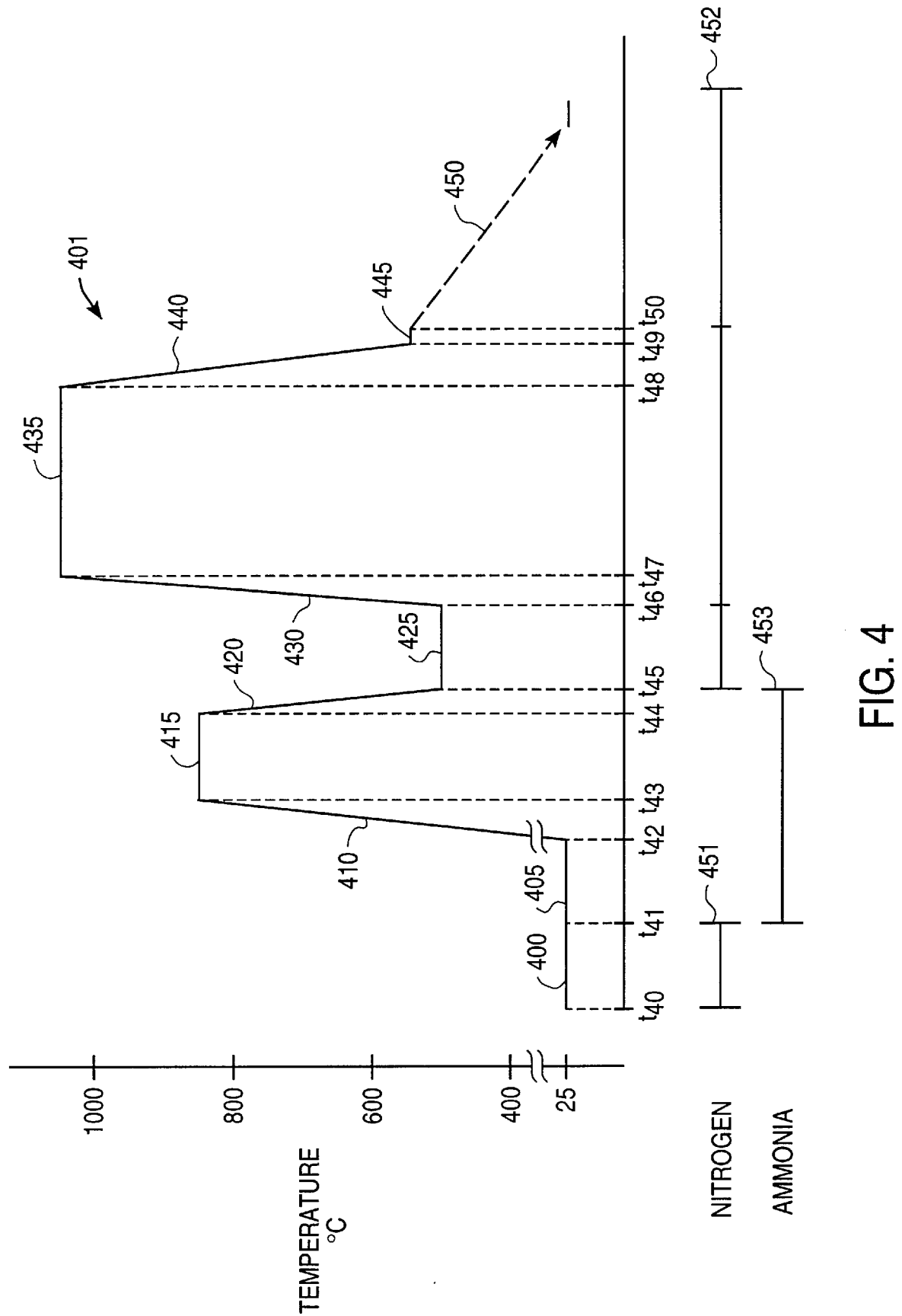
FIG. 4 shows a diagram of the nitridation process of FIG. 3.

Next, as shown in step 145, the substrate is put through the RTP cycle, which is shown in FIGS. 3 and 4. Although the present invention uses the process according to that shown in FIGS. 1 and 2 to form the oxide prior to nitridation, it will be appreciated that the oxide formed in FIGS. 1 and 2 may be used without nitridation, where a non-nitrided oxide is desired. Furthermore, it will be appreciated that the nitridation process described in conjunction with FIGS. 3 and 4 may be used to nitridize an oxide layer formed by materially different processes than that described in relation to FIGS. 1 and 2. In general, the nitridation process of FIGS. 3 and 4 does not add to the thickness of the oxide layer previously formed.

As mentioned earlier, the parameters of the various flow rates, times, and temperatures may be varied from that described herein without departing from the spirit and scope of the present invention. As a further example of this, the relative times of the dry and wet oxidations may be appropriately adjusted to achieve the desired thickness. For example, for a greater thickness than the 53 Å mentioned above, both the wet and dry oxidation time may be increased, or only one may be increased. As a further example, the same thicknesses may be achieved by increasing the time of one while decreasing the time of another. Additionally, the temperatures may be varied from those described herein. Generally, higher temperatures will result in greater oxide growth, and lower temperatures will result in less oxide growth. The temperatures may preferably be within approximately +/−100° C. from those described herein, more preferably within approximately +/−50° C. from those described herein, and most preferably within approximately +/−25° C. from those described herein. Of course, if desired, temperatures outside these ranges may be used for one or more steps. The minimum temperature of the chlorinated oxidation should be such that chlorine is produced from the chlorine-containing compound, and should be such that when a carbon-containing compound is used as a source of chlorine, all carbon is completely oxidized to prevent defects. Additionally, the temperature should be such that a volatile compound results from the reaction of chlorine with the contaminant to be removed. Once again, numerous variations will be apparent to one skilled in the art upon reading the present disclosure.

Referring now to FIG. 3, in step 300 the wafers are loaded into the RTP system. In a preferred embodiment, the system is an A.G. Associates 8108 RTP system. Referring to FIG. 4, the progress of the process is shown by curve 401, which shows the temperature at various stages of the process, and by bars 451–453, which show the gases flowing at any given time during the process. Once again, although a gas may flow through several stages of the process, the flow may change at any time as desired. In step 300, wafer load, as shown by segment 400 of FIG. 4, the temperature of the system is approximately room-temperature (e.g., 25° C.). During the wafer load, pure nitrogen is flowing at a rate of approximately 20 slm. This nitrogen flow is maintained for a time (i.e., the time between $t_{40}$ and $t_{41}$) of 30 seconds. Next, with the system still at approximately 25° C., in step 305, the nitrogen flow is stopped and the ammonia flow is begun. This step is shown as segment 405 of FIG. 4, lasting from $t_{41}$ to $t_{42}$. In a currently preferred embodiment, the flow of ammonia is approximately 5.0 slm. The ammonia flows, with the temperature remaining at approximately 25° C., for a time period of approximately 30 seconds.

Next, in step 310, the temperature is ramped up at a rate of approximately 50° C. per second. Ammonia continues to flow at a rate of approximately 5.0 slm. This portion of the process is shown as segment 410 of FIG. 4. The time of this step, i.e. the time between $t_{42}$ and $t_{43}$ is approximately 17 seconds. Next, in step 315 an ammonia anneal, at 850° C. is performed. In this step, the flow of ammonia continues to be approximately 5.0 slm. This step, shown as segment 415 of FIG. 4 is carried out for a time ($t_{43}$ to $t_{44}$) of approximately 30 seconds. It will be appreciated that the anneal may be carried out in, for example, other active nitrogen compounds that nitridize the oxide layer. For example, nitrous oxide ($N_2O$) may be used. As another example, a combination of nitrous oxide and ammonia may be used.

Next, the temperature is ramped down in step 320. In a currently preferred embodiment, the ramp rate is approximately −60° C. per second. In this step, ammonia continues to flow at approximately 5.0 slm. The ramp down is performed until a temperature of approximately 500° C. is reached. The ramp down step 320 takes approximately 5.8 seconds. The ramp down step 320 is shown as segment 420 (from $t_{44}$ to $t_{45}$) of FIG. 4. Next, in step 325 a nitrogen purge is performed. The nitrogen purge is shown as segment 425 of FIG. 4. In this step, the temperature remains at approximately 500° C. During this step, pure nitrogen flows at a rate of approximately 20 slm, for a time ($t_{45}$ to $t_{46}$) of approximately 30 seconds. The nitrogen purge step has the effect of essentially "quenching" the nitridation reaction, and removing all ammonia from the RTP chamber. In this way, no further reaction occurs in the subsequent anneal step described below.

Next, in step 330, a temperature ramp up at a rate of approximately 50° C. per second is performed, to a temperature of approximately 1050° C. The ramp is shown as segment 430 of FIG. 4. The ramp is performed in pure nitrogen at a flow rate of approximately 5.0 slm, and takes approximately 11 seconds ($t_{46}$ to $t_{47}$) to reach 1050° C. Next, in step 335, a nitrogen anneal is carried out at a temperature of approximately 1050° C., with the nitrogen flow continuing at 5.0 slm. This is shown as segment 435 of FIG. 4. This step lasts for a time ($t_{47}$ to $t_{48}$) of approximately 60 seconds in a currently preferred embodiment. Next, in step 340, the temperature is ramped down at a rate of approximately 65° C. per second in nitrogen, with the nitrogen flow remaining at approximately 5.0 slm. This is shown as segment 440 of FIG. 4. This step lasts for a time ($t_{48}$ to $t_{49}$) of approximately 7.7 seconds in a currently preferred embodiment.

Following the temperature ramp down of step 340, in step 345, the temperature is stabilized at approximately 550° C. for 5 seconds, with the nitrogen flow continuing at 5.0 slm. This step is shown as segment 445 of FIG. 4 ($t_{49}$ to $t_{50}$). Finally, in step 350 the temperature is allowed to freefall, i.e., no further heating energy is employed. This is shown as segment 450 of FIG. 4. The wafer is pulled out of the system when the temperature is at approximately 400° C. Upon opening the chamber and removing the wafer, the temperature will continue to fall to approximately room-temperature again.

The nitridation process described in conjunction with FIGS. 3 and 4 has been found to produce a high quality, manufacturable nitrided oxide. The process has been found to result in a low-defect density film, with good thickness control. Further, high transistor reliability is achieved. As described herein, many variations may be had to the process within the scope of the present invention. The nitridation process of FIGS. 3 and 4, or variations thereof, may be used in conjunction with the oxidation process of FIGS. 1 and 2, or variations thereof. Alternatively, other oxidation processes may be used. As mentioned above, the high chlorine concentration dry oxidation is helpful in providing a low-defect film. Various parameters such as flow rates, times, and temperatures may be varied within the spirit and scope of the present invention. For example, much lower temperatures may be used, if desired. In the oxidation process, lower temperatures will result in a thinner film while maintaining the quality of the film.

In the nitridation process, the temperatures may be varied, however, it is believed to be important that the low temperature (e.g., less than approximately 1000° C. and more preferably less than approximately 950° C.) anneal in a nitridizing atmosphere, followed by a high temperature (e.g., greater than approximately 900° C., and more preferably greater than approximately 1000° C.) anneal in an inert ambient, is at least partly responsible for providing a manufacturable nitridation process. The time and ramp rates may be varied as well. Preferably each of the various steps of the RTP process (such as steps 300, 305, 315, 325 and 335, for example) that are performed for a period of time may be performed approximately 5 seconds or greater, and more preferably approximately 10 seconds or greater. Also, each of the steps are preferably performed for a time of 120 seconds or less, and more preferably 90 seconds or less. The ramp up and ramp down rates are preferably within approximately +/-50° C. per second and more preferably within approximately +/-25° C. per second of those described earlier. Furthermore, a nitrogen purge, preferably at a lower temperature than the nitridation and anneal, such as step 325 of FIG. 3 is believed helpful in providing controllability to the nitridation process. In general, the purge steps described herein are preferably carried out in pure or essentially pure nitrogen. Alternatively, other inert gases or combinations of inert gases may be used. Additionally, it would be appreciated that, if desired, small amounts of chemical active species may be added, depending upon the particular application of the film to be formed.

In one embodiment, after the RTP cycle of FIGS. 3 and 4, the substrate is placed back in the furnace for a further anneal. This further anneal is carried out in an inert ambient, such as nitrogen. In a preferred embodiment, the temperature of the anneal is preferably below approximately 700° C., and more preferably in the range of approximately 600° C. through 650° C. Also in a preferred embodiment, the anneal is carried out for a time of approximately 3–10 minutes and preferably approximately 5 minutes, although other times may be used. This anneal is preferably carried out in the furnace, as a batch of wafers can be done simultaneously. Use of the RTP system, which is a single wafer system, will result in greatly reduced throughput. This final anneal has been found to make the nitrogen distribution in the final film more uniform. However, the process as described herein, without the additional furnace anneal, has been found to result in a satisfactory nitrided oxide.

Figure 5:
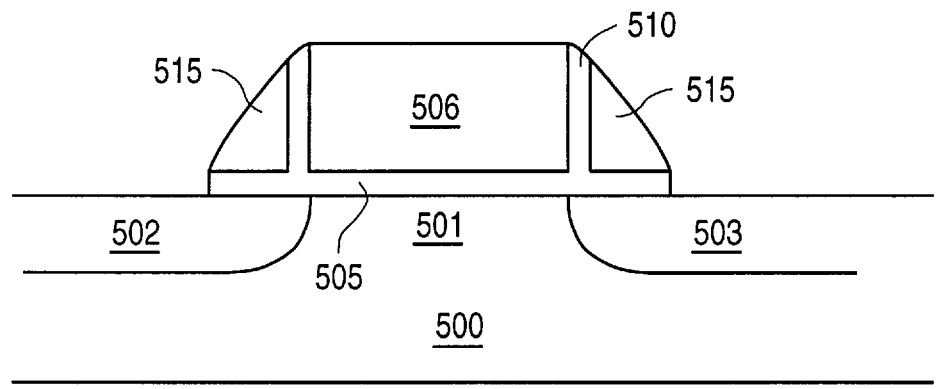
FIG. 5 shows an embodiment of the nitrided oxide layer of the present invention used as a gate oxide, and as a portion of a sidewall spacer.

As described above, the foregoing processes can be used wherever a high quality, low-defect oxide layer having good barrier characteristics is desired. Referring to FIG. 5, a portion of a semiconductor device formed on a semiconductor substrate is shown. The device comprises source 502, drain 503, with channel region 501 therebetween. Overlying channel region 501 is gate oxide 505. The gate oxide may be the nitrided oxide formed by the process described herein. The thickness of layer 505 depends upon the time of the oxidation. Once again, as described above, the gate oxide 505 may be formed by the oxidation process of FIGS. 1 and 2, or may be formed by a different oxidation process, followed by the nitridation process of FIGS. 3 and 4. Of course, the above-described variations in either or both of the oxidation and nitridation processes may be used. The gate oxide 505 provides for a high hot-electron reliability, and low-defect density as described herein.

Also, as shown in FIG. 5, gate electrode 506 overlies the channel region 501 and a portion of the source 502 and drain 503. As shown, a nitrided oxide layer 510 is present on gate electrode 506 as a portion of a composite sidewall spacer. The nitrided oxide layer 510 is formed subsequent to the gate oxide 505 in a separate process. Nitrided oxide layer 510 may be formed, for example, by performing an oxidation cycle such as that described herein, or other oxidation of the gate electrode 506, followed by the nitridation process of the present invention. Alternatively other nitradation processes may be used. Because the nitrided oxide of the present invention is a very good barrier to contaminants, the presence of oxide layer 510 on at least a portion of gate electrode 506 further improves device reliability by preventing contaminant migration to the channel region 501 and gate oxide region 505. If desired, other layers may be disposed between gate electrode 506 and oxide 510, or may be disposed on oxide layer 510. For example, as shown, layer 515 forms a portion of the composite sidewall spacer. The structure of FIG. 5 is formed by, after formation of nitrided oxide layer 510, depositing a further layer such as a dielectric, e.g., an oxide layer, a nitride layer, or a combination of oxide and nitride. Next, an anisotropic etch is performed to leave the portion 515 shown. Formation of a sidewall structure is well known in the art.

Other variations may be had. For example, the layer 510 may remain on the top of gate electrode 506 if desired. Further, other applications for the oxide according to any embodiment of the present invention may be had. For example, the nitrided oxide layer, formed using the oxidation cycle of the present invention or other oxidation cycles may be used as a portion of the trench dielectric, as all or a portion of an inter-gate dielectric in a memory device, or other uses. In general, any application that requires a high quality, low-defect, manufacturable oxide that is a good barrier to dielectrics can benefit from a nitrided oxide formed by any embodiment of the present invention. It will be appreciated that, although FIG. 5 shows a gate oxide 505, and a portion of a spacer 510 on a single device, the present invention does not necessarily need to be used in both applications on the same device. For example, a device may have a gate oxide formed by other methods, while still using the spacer 510 of the present invention. Alternatively, a device may be formed with a gate oxide 505 of the present invention, while using a spacer formed by other methods.

Figure 6:
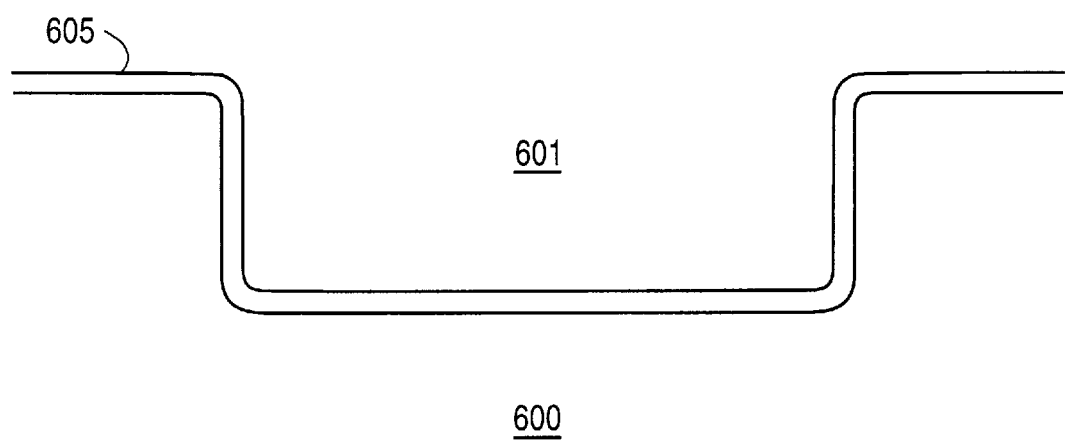
FIG. 6 shows an embodiment of the present invention used as a portion of an oxide formed in a trench in a semiconductor substrate.

FIG. 6 shows a trench 601 formed in semiconductor substrate 600. The trench 601 may be formed as a portion of field isolation between devices. The trench may be formed by known methods. In one embodiment of the present invention, following formation of the trench 601, an oxide layer 605 of the present invention is next formed. Again, the oxide layer may be formed by the method shown in FIGS. 1 and 2, or variants thereof, or other methods. Then, the nitridation of FIGS. 3 and 4, or variants thereof, may be performed. Alternatively other nitridation processes may be used. The use of an oxidation process having at least a portion of the oxide layer formed by a wet oxidation results in generally smoother corners, which helps relieve stresses formed on the substrate. Following the stage shown in FIG. 6, the trench 601 is typically filled in by deposition of a dielectric such as an oxide layer, that may generally be coincident with the surface of the semiconductor substrate 600.

Thus, a method for forming a nitrided oxide layer has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of forming an oxide layer comprising the steps of:
    a) providing a semiconductor substrate;
    b) placing said semiconductor substrate in a furnace;
    c) exposing said semiconductor substrate to a first ambient at a first temperature, said first ambient comprising a chlorine containing compound;
    d) exposing said semiconductor substrate to a second ambient at a second temperature, said second ambient comprising steam, said semiconductor substrate having an oxide layer formed thereon subsequent to said steps of exposing said semiconductor substrate to said first ambient and said second ambient;
    e) exposing said semiconductor substrate to a third ambient at a third temperature in an RTP system, said third ambient comprising a nitrogen-containing compound that nitridizes at least a portion of said oxide layer to form a nitrided oxide layer; and
    f) exposing said semiconductor substrate to a fourth ambient at a fourth temperature, said fourth ambient comprising an inert gas.

2. The method as described in claim 1 wherein said step b) is performed by pushing said substrate into said furnace in a flow of gas comprising an inert gas and approximately 5% or less oxygen.

3. The method as described in claim 1 further comprising the step of annealing said substrate in an ambient comprising an inert gas after said step d).

4. The method as described in claim 1 wherein said fourth temperature is greater than said third temperature.

5. The method as described in claim 1 further comprising the step of exposing said semiconductor substrate to a fifth ambient at a fifth temperature between said steps e) and f), said fifth ambient comprising an inert gas, wherein said fifth temperature is below said third temperature and below said fourth temperature.

6. The method as described in claim 1 wherein said first temperature is below approximately 850° C., wherein said second temperature is below approximately 850° C., wherein said third temperature is below approximately 1000° C., and wherein said fourth temperature is above approximately 900° C.

7. The method as described in claim 2 wherein said first temperature is below approximately 850° C., wherein said second temperature is below approximately 850° C., wherein said third temperature is below approximately 1000° C., and wherein said fourth temperature is above approximately 900° C.

8. The method as described in claim 3 wherein said first temperature is below approximately 850° C., wherein said second temperature is below approximately 850° C., wherein said third temperature is below approximately 1000° C., and wherein said fourth temperature is above approximately 900° C.

9. The method as described in claim 4 wherein said first temperature is below approximately 850° C., wherein said second temperature is below approximately 850° C., wherein said third temperature is below approximately 1000° C., and wherein said fourth temperature is above approximately 900° C.

10. The method as described in claim 5 wherein said first temperature is below approximately 850° C., wherein said second temperature is below approximately 850° C., wherein said third temperature is below approximately 1000° C., and wherein said fourth temperature is above approximately 900° C.

11. The method as described in claim 5 wherein said fifth temperature is below approximately 650° C.

12. The method as described in claim 10 wherein said fifth temperature is below approximately 650° C.

13. The method as described in claim 1 wherein said first ambient comprises approximately 9% or greater volume concentration chlorine.

14. The method as described in claim 1 wherein said chlorinecontaining compound comprises DCE.

15. The method as described in claim 1 wherein said nitrided oxide layer is formed as a gate dielectric of a semiconductor device.

16. The method as described in claim 1 wherein said nitrided oxide layer is formed as a portion of a spacer, said spacer formed on a gate electrode of a semiconductor device.

17. The method as described in claim 1 wherein said nitrided oxide layer is formed in a trench formed in a semiconductor substrate.

18. The method as described in claim 1 wherein said oxide layer has a thickness in the range of approximately 20–80 Å.

19. The method as described in claim 2 wherein said oxide layer has a thickness in the range of approximately 20–80 Å.

20. The method as described in claim 3 wherein said oxide layer has a thickness in the range of approximately 20–80 Å.

21. The method as described in claim 4 wherein said oxide layer has a thickness in the range of approximately 20–80 Å.

22. The method as described in claim 5 wherein said oxide layer has a thickness in the range of approximately 20–80 Å.

23. The method as described in claim 6 wherein said oxide layer has a thickness in the range of approximately 20–80 Å.

24. The method as described in claim 8 wherein said oxide layer has a thickness in the range of approximately 20–80 Å.

25. The method as described in claim 3 wherein said temperature is below approximately 850° C. during said step of annealing said substrate.

26. The method as described in claim 1 further comprising the step of annealing said substrate after said step f) in an ambient comprising an inert gas.

27. The method as described in claim 26 wherein said anneal is performed at a temperature of approximately 700° C. or less.

28. A method of treating an oxide layer comprising:
 a) providing a semiconductor substrate having an oxide layer thereon;
 b) exposing said oxide layer to a first ambient at a first temperature in an RTP system, said first ambient comprising a nitrogen-containing compound that nitridizes at least a portion of said oxide layer;
 c) exposing said oxide layer to a second ambient at a second temperature, said second temperature greater than said first temperature, said second ambient comprising an inert gas.

29. The method as described in claim 28 further comprising the step of exposing said semiconductor substrate to a third ambient at a third temperature between said steps b) and c), said third ambient comprising an inert gas, wherein said third temperature is below said first temperature and below said second temperature.

30. The method as described in claim 28 wherein said first temperature is below approximately 1000° C., and wherein said second temperature is above approximately 900° C.

31. The method as described in claim 29 wherein said first temperature is below approximately 1000° C., and wherein said second temperature is above approximately 900° C.

32. The method as described in claim 29 wherein said third temperature is below approximately 650° C.

33. The method as described in claim 31 wherein said third temperature is below approximately 650° C.

34. The method as described in claim 28 wherein said method is performed on an oxide layer formed as a gate dielectric of a semiconductor device.

35. The method as described in claim 28 wherein said method is performed on an oxide layer formed as a portion of a spacer, said spacer formed on a gate electrode of a semiconductor device.

36. The method as described in claim 28 wherein said method is performed on an oxide layer formed in a trench formed in a semiconductor substrate.

37. The method as described in claim 28 further comprising the step of annealing said substrate after said step c) in an ambient comprising an inert gas.

38. The method as described in claim 37 wherein said anneal is performed at a temperature of approximately 700° C. or less.

* * * * *